(12) United States Patent
Kang

(10) Patent No.: US 7,613,059 B2
(45) Date of Patent: Nov. 3, 2009

(54) SEMICONDUCTOR MEMORY DEVICE AND METHOD FOR DRIVING THE SAME

(75) Inventor: Khil-Ohk Kang, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 10 days.

(21) Appl. No.: 12/003,547

(22) Filed: Dec. 28, 2007

(65) Prior Publication Data
US 2008/0219073 A1 Sep. 11, 2008

(30) Foreign Application Priority Data
Mar. 5, 2007 (KR) .................. 10-2007-0021371

(51) Int. Cl.
*G11C 7/02* (2006.01)
(52) U.S. Cl. .................. 365/207; 365/204
(58) Field of Classification Search .................. 365/207, 365/204, 189.11
See application file for complete search history.

(56) References Cited

U.S. PATENT DOCUMENTS

| 5,777,939 | A * | 7/1998 | Won ........................ 365/222 |
| 6,347,058 | B1 | 2/2002 | Houghton et al. |
| 6,754,122 | B2 * | 6/2004 | Wada et al. ............ 365/207 |
| 7,020,043 | B1 | 3/2006 | Lee |
| 7,038,757 | B2 | 5/2006 | Park et al. |
| 7,158,430 | B2 | 1/2007 | Byun |
| 7,184,342 | B2 * | 2/2007 | Seo ........................ 365/203 |
| 7,450,448 | B2 * | 11/2008 | Do ........................ 365/196 |
| 2006/0267630 | A1 | 11/2006 | Matsui |
| 2006/0268630 | A1 | 11/2006 | Park et al. |

FOREIGN PATENT DOCUMENTS

| JP | 11-273346 | 10/1999 |
| JP | 2006-286163 | 10/2006 |
| JP | 2006-309926 | 11/2006 |
| KR | 1020050009012 | 1/2005 |

OTHER PUBLICATIONS

Notice of Allowance issued from Korean Intellectual Property Office on Feb. 9, 2009 with an English Translation.

* cited by examiner

*Primary Examiner*—Anh Phung
(74) *Attorney, Agent, or Firm*—IP & T Law Firm PLC

(57) ABSTRACT

A semiconductor memory device can stabilize a voltage level of a normal driving voltage terminal in a normal driving operation, which is performed after an overdriving operation, even when an overdriving voltage is unstable due to environmental factors of the semiconductor memory device in the overdriving operation. The semiconductor memory device includes a bit line sense amplifier for performing an amplification operation using a normal driving voltage or an overdriving voltage to sense and amplify data applied to bit lines, a normal driving voltage compensator configured to drive a normal driving voltage terminal according to a voltage level of the normal driving voltage terminal and target normal driving voltage levels, and a discharge enable signal generator configured to generate a discharge enable signal by adjusting an activation period of the discharge enable signal according to the overdriving voltage.

15 Claims, 6 Drawing Sheets

SEMICONDUCTOR MEMORY DEVICE AND METHOD FOR DRIVING THE SAME

CROSS-REFERENCE TO RELATED APPLICATIONS

This application claims priority to Korean patent application number 10-2007-0021371, filed on Mar. 5, 2007, which is incorporated by reference in its entirety.

BACKGROUND OF THE INVENTION

The subject matter relates to a semiconductor memory device, and more particularly to a semiconductor memory device having a bit line sense amplifier with a structure for overdriving. More specifically, the present invention relates to a circuit that can stabilize a voltage applied to a normal driving voltage terminal in an overdriving operation and a subsequent normal driving operation.

As the line width and cell size in semiconductor memory designs have been gradually scaled down, semiconductor memory devices have been designed to operate with a lower power supply voltage. Thus, there is a demand for a design technique providing the desired performance in a low-voltage environment.

In most semiconductor memory devices, there is an integrated internal voltage generator for receiving an external power supply voltage (VDD) to generate an internal voltage. Therefore, a semiconductor memory device generates a voltage for operating an internal circuit via an internal voltage generator for itself.

A memory device such as a dynamic random access memory (DRAM), which utilizes a bit line sense amplifier, uses a normal driving voltage (generally, a core voltage (VCORE)) to detect a cell data.

When a word line selected by a row address is enabled, data of a plurality of memory cells connected to the selected word line are transferred to bit lines, and corresponding bit line sense amplifiers each sense and amplify a voltage difference of a bit line pair.

Generally, several thousands of bit line sense amplifiers are operated at the same time. Thus, a large amount of current is consumed on a normal driving voltage terminal at once, which is used in driving a pull-up voltage line of the bit line sense amplifiers, called RTO.

However, in the trend of lower operating voltage, there are limitations for amplifying the data of a large number of memory cells at once in a short period of time by using the normal driving voltage.

To solve this problem, a bit line sense amplifier overdriving scheme was adopted. In an initial operation of the bit line sense amplifier, that is, immediately after a charge sharing between a memory cell and a bit line pair, a voltage line RTO of the bit line sense amplifier is driven by an overdriving voltage (generally, a power supply voltage (VDD)) higher than a normal driving voltage (generally, a core voltage (VCORE)) for a predetermined time.

FIG. 1 is a block diagram of a conventional semiconductor memory device having a bit line sense amplifier with a structure for an overdriving.

Referring to FIG. 1, the conventional semiconductor memory device includes a bit line sense amplifier 100, a voltage line driver 120, a normal driving voltage charge driver 140, and a normal driving voltage discharge driver 160. The bit line sense amplifier 100 senses and amplifies a data applied to bit lines. The voltage line driver 120 drives voltage lines RTO and SB of the bit line sense amplifier 100 to a normal driving voltage or an overdriving voltage. The normal driving voltage charge driver 140 pulls up a normal driving voltage terminal when a voltage level of the normal driving voltage terminal is lower than a first target normal driving voltage level. The normal driving voltage discharge driver 160 pulls down a normal driving voltage terminal when the voltage level of the normal driving voltage terminal is higher than a second target normal driving voltage level.

The voltage line driver 120 includes an overdriving unit 122 and a normal driving unit 124. The overdriving unit 122 drives the voltage lines RTO and SB of the bit line sense amplifier 100 to the overdriving voltage in the overdriving period. The normal driving unit 124 drives the voltage lines RTO and SB of the bit line sense amplifier 100 to the normal driving voltage in the normal driving period.

An operation of the conventional semiconductor memory device will be described below.

The voltage line driver 120 drives the voltage lines RTO and SB of the bit line sense amplifier 100 to the overdriving voltage in the overdriving period in response to an overdriving signal SAOVDP. Then, the voltage line driver 120 drives the voltage lines RTO and SB of the bit line sense amplifier 100 to the normal driving voltage in the normal driving period.

In response to a charge enable signal CEP, the normal driving voltage charge driver 140 pulls up the normal driving voltage terminal when the voltage levels of the voltage lines RTO and SB are lower than the first target normal driving voltage level in the overdriving period and the normal driving period with respect to a reference voltage VREF1 corresponding to the first target normal driving voltage level.

In response to a discharge enable signal DCEP, the normal driving voltage discharge driver 160 pulls down the normal driving voltage terminal when the voltage levels of the voltage lines RTO and SB are higher than the second target normal driving voltage level in the overdriving period and the normal driving period with respect to a second reference voltage VREF2 corresponding to the second target normal driving voltage level.

The normal driving voltage charge driver 140 is designed to maintain the normal driving voltage terminal to a voltage level higher than the first target normal driving voltage level. The voltage level at the normal driving voltage terminal may be decreased by the use of the normal driving voltage at the operation of the semiconductor memory device or a natural discharge. Therefore, the operation of the normal driving voltage charge driver is determined by the voltage level of the normal driving voltage terminal in such a state that the charge enable signal CEP is activated, regardless of the operation of the semiconductor memory device.

Like the normal driving voltage charge driver 140, the normal driving voltage discharge driver 160 is designed to maintain the normal driving voltage terminal to a voltage level lower than the second target normal driving voltage level. Therefore, basically in such a state that the discharge enable signal DCEP is activated, it is determined whether the normal driving voltage discharge driver operates or not by the voltage level of the normal driving voltage terminal.

However, in a specific operation such as the overdriving operation, if a discharge operation is performed because the voltage level of the normal driving voltage terminal is higher than the second target normal driving voltage level, a normal overdriving operation cannot be achieved.

Therefore, in the case of specific operations such as the overdriving operation, the discharge enable signal DCEP is activated for a predefined time with a predefined timing after an overdriving operation begins.

However, in the case of the overdriving voltage, power supply voltage VDD is used, which is provided from outside of the semiconductor memory device. Due to environmental factors that affect the overdriving voltage, it may be higher or lower than a predefined level when supplied to the semiconductor memory device. That is, since the overdriving voltage is provided from the outside of the semiconductor memory device, its voltage level may fluctuate.

In the overdriving operation using an overdriving voltage lower or higher than the predefined level and the subsequent normal driving operation, the corresponding level of the normal driving voltage terminal may vary as described below.

FIG. 2 is a signal timing diagram illustrating voltages applied to the normal driving voltage terminal in the overdriving operation and the subsequent normal driving operation of a conventional semiconductor memory device.

It can be seen from FIG. 2 that the voltage applied to the normal driving voltage terminal varies according to the overdriving voltage level in the overdriving operation and the subsequent normal driving operation.

In a case ② where the predefined level (normal VDD) is inputted as the overdriving voltage level, the voltage level of the normal driving voltage terminal, which is increased in the overdriving operation, returns to the level (normal VCORE) defined prior to the overdriving operation due to the operation of the normal driving voltage discharge driver 160.

However, in a case ① where the supplied overdriving voltage level is higher than the predefined level, that is, the overdriving voltage level is a high VDD, the voltage level of the normal driving voltage terminal, which increases more than when a normal VDD is supplied during the overdriving operation, does not return to the normal VCORE level from prior to the overdriving operation, but remains at a higher level, in spite of the operation of the normal driving voltage discharge driver 160.

Further, in a case ③ where the supplied overdriving voltage level is lower than the predefined level, that is, the overdriving voltage level is a low VDD, the voltage level of the normal driving voltage terminal, which increases less than when a normal VDD is supplied during the overdriving operation, falls below the normal VCORE from prior to the overdriving operation due to the operation of the normal driving discharge driver 160.

As described above, when a voltage level higher or lower than a normal VDD is supplied as the overdriving voltage level, the voltage level of the normal driving voltage terminal does not return to the normal VCORE from prior to an overdriving operation, in spite of the normal operation of the normal driving discharge driver 160.

When the voltage does not return to the normal VCORE level after the overdriving operation, and is directly applied to the voltage lines RTO and SB of the bit line sense amplifier 100 in the normal driving operation, the bit line sense amplifier 100 may perform an erroneous operation, resulting in defective operation of the semiconductor memory device.

SUMMARY OF THE INVENTION

Embodiments of the present invention are directed to providing a circuit that can stabilize a voltage level of a normal driving voltage terminal in a normal driving operation, which is performed after an overdriving operation, even when an overdriving voltage is unstable due to environmental factors of a semiconductor memory device in the overdriving operation.

In one embodiment, a semiconductor memory device includes a bit line sense amplifier for performing an amplification operation using a normal driving voltage or an overdriving voltage to sense and amplify data applied to bit lines, a normal driving voltage compensator configured to drive a normal driving voltage terminal according to a voltage level of the normal driving voltage terminal and target normal driving voltage levels, and a discharge enable signal generator configured to generate a discharge enable signal by adjusting an activation period of the discharge enable signal according to the overdriving voltage.

In a second embodiment, a semiconductor memory device includes a bit line sense amplifier configured to sense and amplify data applied to bit lines, a voltage line driver configured to drive voltage lines of the bit line sense amplifier to a normal driving voltage or an overdriving voltage, a normal driving voltage charge driver configured to pull up a normal driving voltage terminal when a voltage level of the normal driving voltage terminal is lower than a first target normal driving voltage level, a normal driving voltage discharge driver configured to pull down the normal driving voltage terminal when the voltage level of the normal driving voltage terminal is higher than a second target normal driving voltage level during an activation period of a discharge enable signal, a voltage detector configured to detect the overdriving voltage level to output a plurality of detection signals, levels of which are determined according to the detection result, and a activation period adjusting unit configured to adjust the activation period of the discharge enable signal according to the detection signals.

In a third embodiment, a semiconductor memory device includes a bit line sense amplifier configured to sense and amplify data applied to bit lines, a voltage line driver configured to drive voltage lines of the bit line sense amplifier to a normal driving voltage or an overdriving voltage, a normal driving voltage charge driver configured to pull up a normal driving voltage terminal when a voltage level of the normal driving voltage terminal is lower than a first target normal driving voltage level, a normal driving voltage discharge driver configured to pull down the normal driving voltage terminal when the voltage level of the normal driving voltage terminal is higher than a second target normal driving voltage level during an activation period of a discharge enable signal, and a discharge enable signal generator configured to generate the discharge enable signal by adjusting the activation period of the discharge enable signal according to an overdriving voltage level.

In a fourth embodiment, a method for driving a semiconductor memory device having a bit line sense amplifier with a structure for an overdriving includes driving voltage lines of the bit line sense amplifier to an overdriving voltage or a normal driving voltage, pulling up a normal driving voltage terminal when a voltage level of the normal driving voltage terminal is lower than a first target normal driving voltage level, pulling down the normal driving voltage terminal when the voltage level of the normal driving voltage terminal is higher than a second target normal driving voltage level in an activation period of a discharge enable signal, and generating a discharge enable signal by adjusting the activation period of the discharge enable signal according to the overdriving voltage level.

DESCRIPTION OF SPECIFIC EMBODIMENTS

Hereinafter, a semiconductor memory device and a method for driving the same in accordance with embodiments of the present invention will be described in detail with reference to the accompanying drawings.

Figure 1:
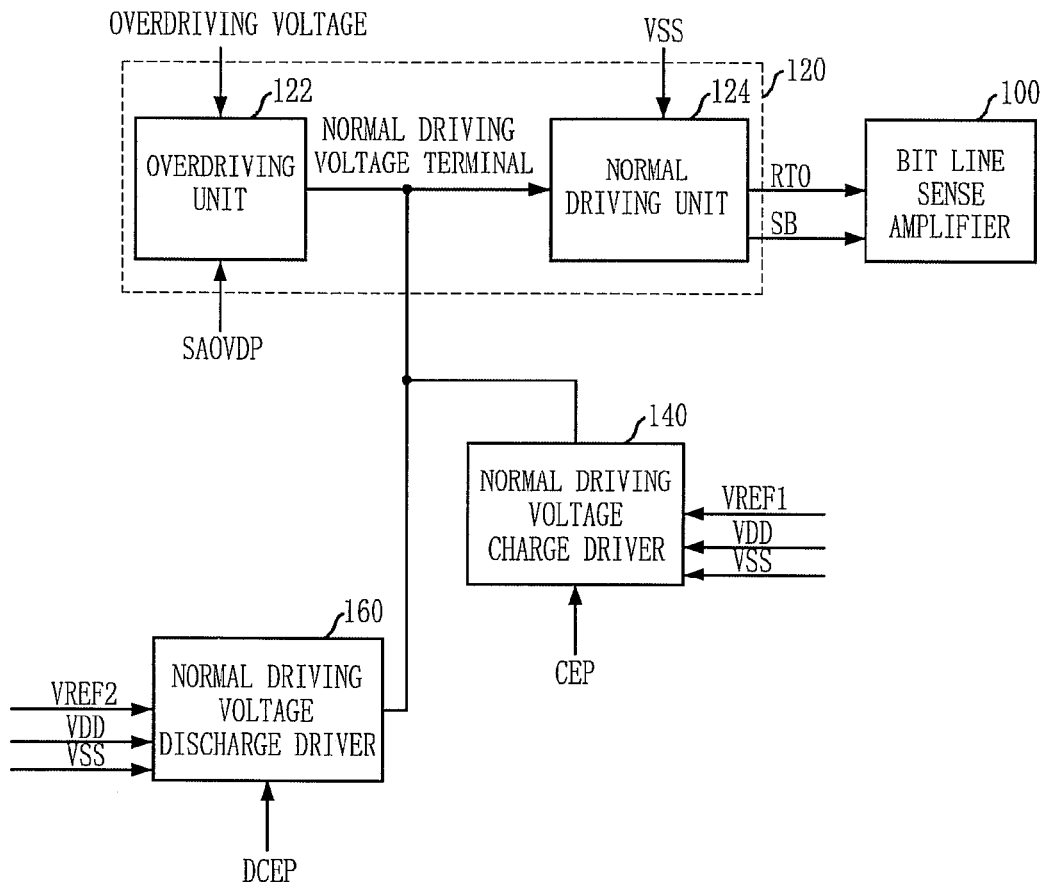
FIG. 1 is a block diagram of a conventional semiconductor memory device having a bit line sense amplifier with a structure for an overdriving.
Figure 2:
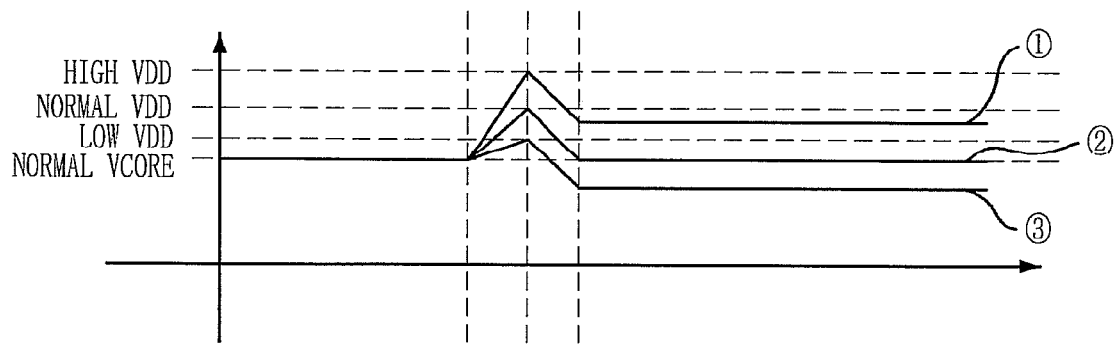
FIG. 2 is a signal timing diagram illustrating voltages applied to a normal driving voltage terminal in an overdriving operation and the subsequent normal driving operation of the conventional semiconductor memory device.
Figure 3:
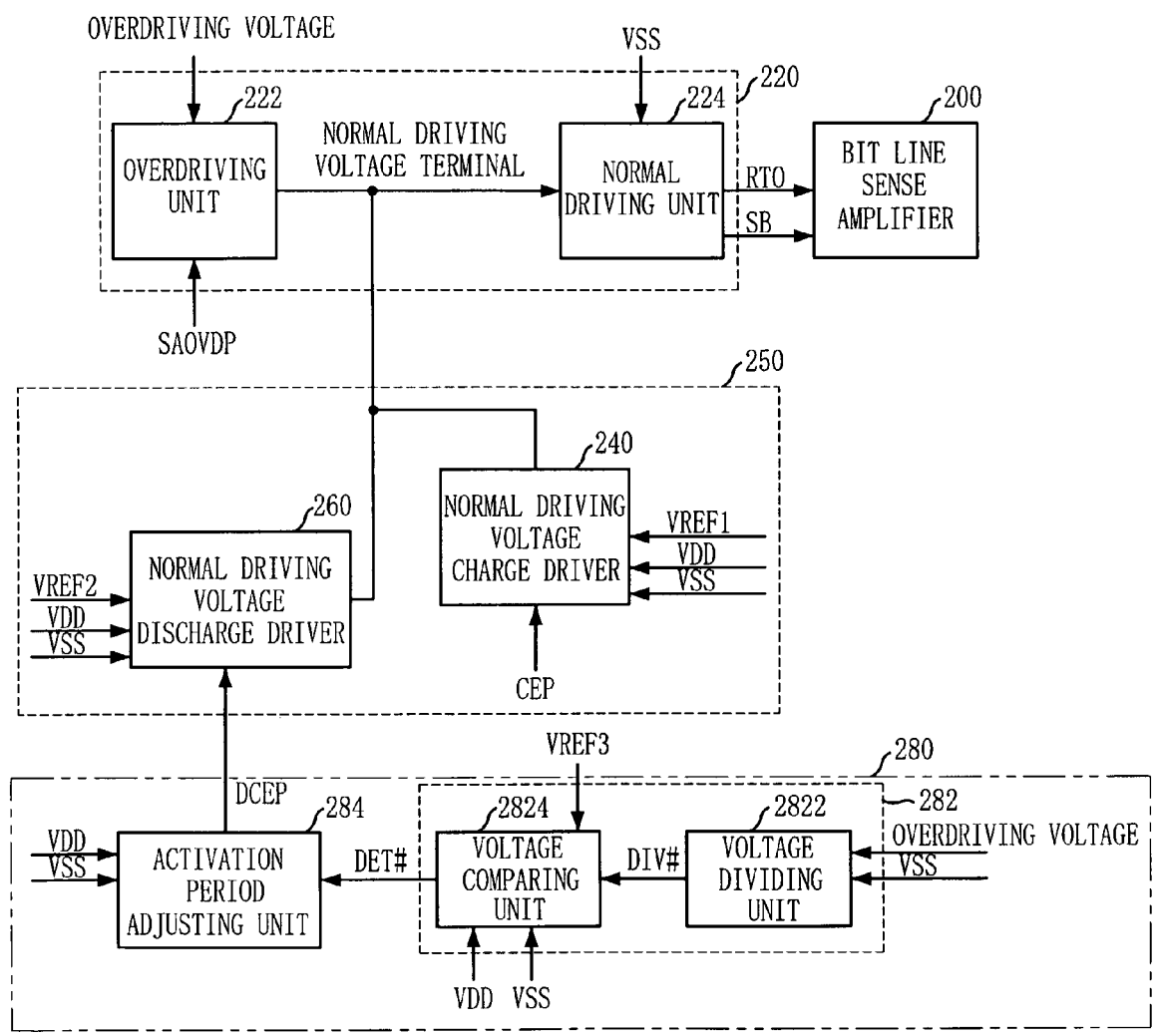
FIG. 3 is a block diagram of a semiconductor memory device having a bit line sense amplifier in accordance with an embodiment of the present invention.

FIG. 3 is a block diagram of a semiconductor memory device having a bit line sense amplifier in accordance with an embodiment of the present invention.

Referring to FIG. 3, the semiconductor memory device includes a bit line sense amplifier 200, a voltage line driver 220, a normal driving voltage compensator 250, and a discharge enable signal generator 280. The bit line sense amplifier 200 senses and amplifies data applied to a bit line. The voltage line driver 220 drives voltage lines RTO and SB of the bit line sense amplifier 200 to a normal driving voltage or an overdriving voltage. The normal driving voltage compensator 250 drives a normal driving voltage terminal according to a voltage level of the normal driving voltage terminal and target normal driving voltage levels. The normal driving voltage compensator 250 includes a normal driving voltage charge driver 240 and a normal driving voltage discharge driver 260.

The normal driving voltage charge driver 240 pulls up a normal driving voltage terminal when a voltage level of the normal driving voltage terminal is lower than a first target normal driving voltage level in case that a charge enable signal CEO is activated. The normal driving voltage discharge driver 260 pulls down the normal driving voltage terminal when the voltage level of the normal driving voltage terminal is higher than a second target normal driving voltage level in case that a discharge enable signal DCEP is activated.

The discharge enable signal generator 280 generates the discharge enable signal DCEP by adjusting the activation period of the discharge enable signal DCEP according to the voltage level of the overdriving voltage. The discharge enable signal generator 280 includes a voltage detecting unit 282 and an activation period adjusting unit 284. The voltage detecting unit 282 detects the overdriving voltage level to output a plurality of detection signals DET#, the levels of which are determined according to the detection result. The activation period adjusting unit 284 adjusts the activation period of the discharge enable signal DCEP according to activated detection signals DET#.

The voltage detecting unit 282 of the discharge enable signal generator 280 includes a voltage dividing unit 2822 and a voltage comparing unit 2824. The voltage dividing unit 2822 divides the overdriving voltage by a plurality of ratios to produce a plurality of respective divided voltages DIV# at different levels. The voltage comparing unit 2824 compares a reference voltage VREF3 corresponding to the target overdriving voltage level with each of the divided voltages DIV# to output the plurality of detection signals DET#, levels of each determined by a respective comparison result.

An operation of a semiconductor memory device in accordance with the embodiment of the present invention will be described below.

The voltage line driver 220 drives the voltage lines RTO and SB of the bit line sense amplifier 200 to the overdriving voltage in the overdriving period in response to an overdriving signal SAOVDP. Then, the voltage line driver 220 drives the voltage lines RTO and SB of the bit line sense amplifier 200 to the normal driving voltage in the normal driving period.

In response to a charge enable signal CEP, the normal driving voltage charge driver 240 pulls up the normal driving voltage terminal when the voltage levels of the voltage lines RTO and SB are lower than the first target normal driving voltage level in the overdriving period and the normal driving period based on a reference voltage VREF1 corresponding to the first target normal driving voltage level.

In response to a discharge enable signal DCEP, the normal driving voltage discharge driver 260 pulls down the normal driving voltage terminal when the voltage levels of the voltage lines RTO and SB are higher than the second target normal driving voltage level in the overdriving period and the normal driving period using a second reference voltage VREF2 corresponding to the second target normal driving voltage level.

The discharge enable signal generator 280 detects the overdriving voltage level during an overdriving operation and adjusts the activation period of the discharge enable signal DCEP according to the detection result.

Thus, the operation period of the normal driving voltage discharge driver 260 is adjusted according to the overdriving voltage level.

Figure 4:
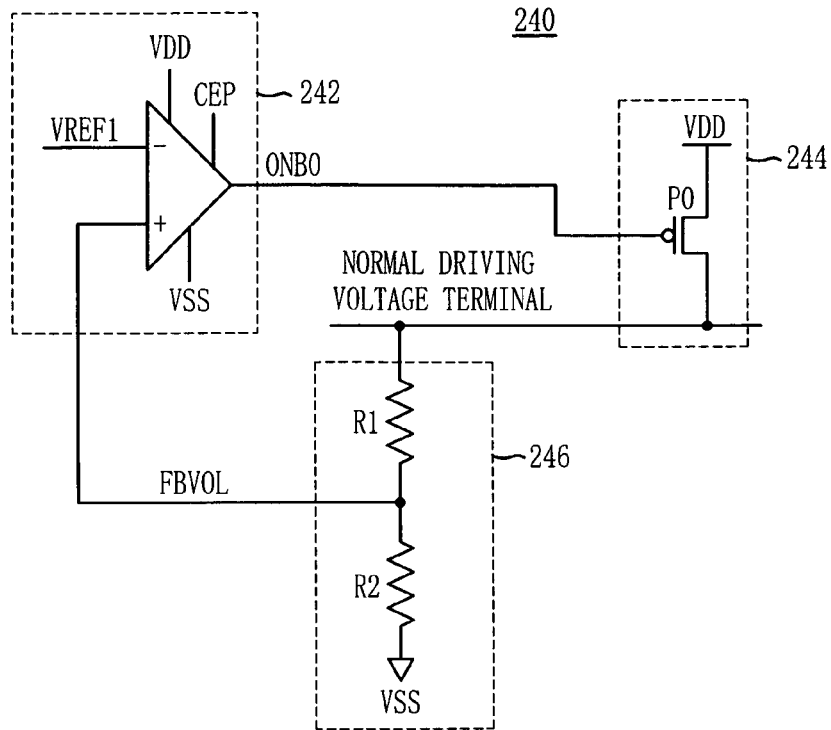
FIG. 4 is a schematic circuit diagram of a normal driving voltage charge driver illustrated in FIG. 3.

FIG. 4 is a schematic circuit diagram of the normal driving voltage charge driver illustrated in FIG. 3.

Referring to FIG. 4, the normal driving voltage charge driver 240 includes a comparator 242, a pull-up driver 244, and a divider 246. The comparator 242 compares the reference voltage VREF1, which corresponds to the first target normal driving voltage level, with a feedback voltage FBVOL, which is fed back from the normal driving voltage terminal. The pull-up driver 244 pulls up the normal driving voltage terminal in response to a comparison signal ONBO outputted from the comparator 242. The divider 246 divides the voltage applied to the normal driving voltage terminal by a predefined ratio to output the feedback voltage FBVOL.

The pull-up driver 244 includes a PMOS transistor P0 configured to connect the power supply voltage VDD to the normal driving voltage terminal in response to the comparison signal ONBO provided by the comparator 242.

An operation of the normal driving voltage charge driver 240 in accordance with the embodiment of the present invention is described below.

The charge enable signal CEP is usually activated during operation of the semiconductor memory device, as described above. Therefore, for the sake of this discussion it is assumed that the comparator 242 always operates.

The divider 246 divides the voltage applied to the normal driving voltage terminal by a predefined ratio to output the feedback voltage FBVOL. The predefined ratio is usually set by a designer.

Although the feedback voltage FBVOL is generated by dividing the voltage applied to the normal driving voltage terminal by using a first resistor R1 and a second resistor R2, as illustrated in FIG. 4, alternatively the voltage applied to the normal driving voltage terminal can be directly applied as the feedback voltage FBVOL.

The comparator 242 compares the feedback voltage FBVOL with the reference voltage VREF1 to output the comparison signal ONBO, a level of which varies according to the comparison result.

The pull-up driver 244 controls the supply of the power supply voltage VDD to the normal driving voltage terminal in response to the voltage level of the comparison signal ONBO.

For example, the comparison signal ONBO becomes a logic low level when the level of the reference voltage VREF1 is higher than the feedback voltage FBVOL. In this situation, the PMOS transistor P0 of the pull-up driver 244 is turned on to supply the power supply voltage VDD to the normal driving voltage terminal, so that the voltage level of the normal driving voltage terminal increases.

Alternatively, the comparison signal ONBO becomes a logic high level when the level of the reference voltage VREF1 is lower than the feedback signal FBVOL. The PMOS transistor P0 of the pull-up driver 244 is turned off so that the power supply voltage VDD is not supplied to the normal driving voltage terminal. Thus, the voltage level of the normal driving voltage terminal decreases due to the operation of the semiconductor memory device consuming the voltage applied to the normal driving voltage terminal or by natural discharge.

Figure 5:
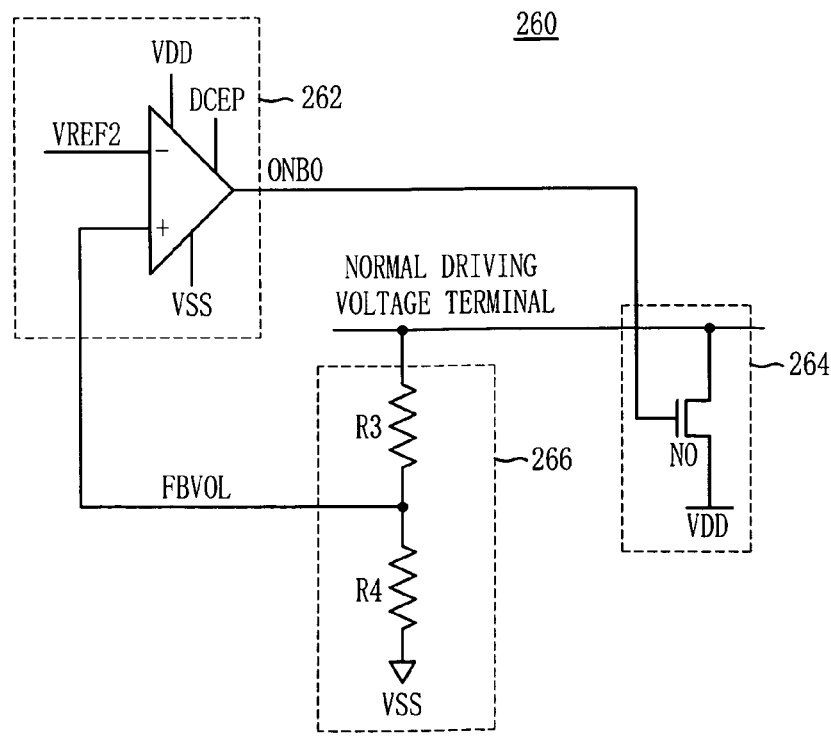
FIG. 5 is a schematic circuit diagram of a normal driving voltage discharge driver illustrated in FIG. 3.

FIG. 5 is a schematic circuit diagram of the normal driving voltage discharge driver illustrated in FIG. 3.

Referring to FIG. 5, the normal driving voltage discharge driver 260 includes a comparator 262, a pull-down driver 264, and a divider 266. The comparator 262 compares the reference voltage VREF2, which corresponds to the second target normal driving voltage level, with the feedback voltage FBVOL, which is fed back from the normal driving voltage terminal. The pull-down driver 264 pulls down the normal driving voltage terminal in response to the comparison signal ONBO. The divider 266 divides the voltage applied to the normal driving voltage terminal by a predefined ratio to output the feedback voltage FBVOL.

The pull-down driver 264 includes an NMOS transistor N0 configured to connect the normal driving voltage terminal to the ground terminal VSS in response to the comparison signal ONBO provided by the comparator 262.

An operation of the normal driving voltage discharge driver 260 in accordance with the embodiment of the present invention will be described below.

The activation period of the discharge enable signal DCEP from the discharge enable signal generator 280 is changed according to the overdriving voltage level. The comparator 262 operates only when discharge enable signal DCEP is active.

The divider 266 divides the voltage applied to the normal driving voltage terminal by a predefined ratio to output the feedback voltage FBVOL. The predefined ratio is usually set by the designer.

Although the feedback voltage FBVOL is generated by dividing the voltage applied to the normal driving voltage terminal by using a first resistor R3 and a second resistor R4, as illustrated in FIG. 5, alternatively the voltage applied to the normal driving voltage terminal can be directly applied as the feedback voltage FBVOL.

The comparator 262 compares the feedback voltage FBVOL with the reference voltage VREF2 to output the comparison signal ONBO, a level of which varies according to the comparison result.

The pull-down driver 264 controls the discharge of the voltage applied to the normal driving voltage terminal in response to the voltage level of the comparison signal ONBO.

For example, the comparison signal ONBO becomes a logic low level when the level of the reference voltage VREF2 is higher than the feedback voltage FBVOL. In this situation, the NMOS transistor N0 of the pull-down driver 264 is turned off so that the voltage applied to the normal driving voltage terminal is not discharged. Thus, the voltage level of the normal driving voltage terminal does not decrease any more, except as consumed by the semiconductor memory device or by natural discharge.

Alternatively, the comparison signal ONBO becomes a logic high level when the level of the reference voltage VREF2 is lower than the feedback signal FBVOL. Then the NMOS transistor N0 of the pull-down driver 264 is turned on so that the voltage applied to the normal driving voltage terminal is discharged. Thus, the voltage level of the normal driving voltage terminal decreases.

Figure 6:
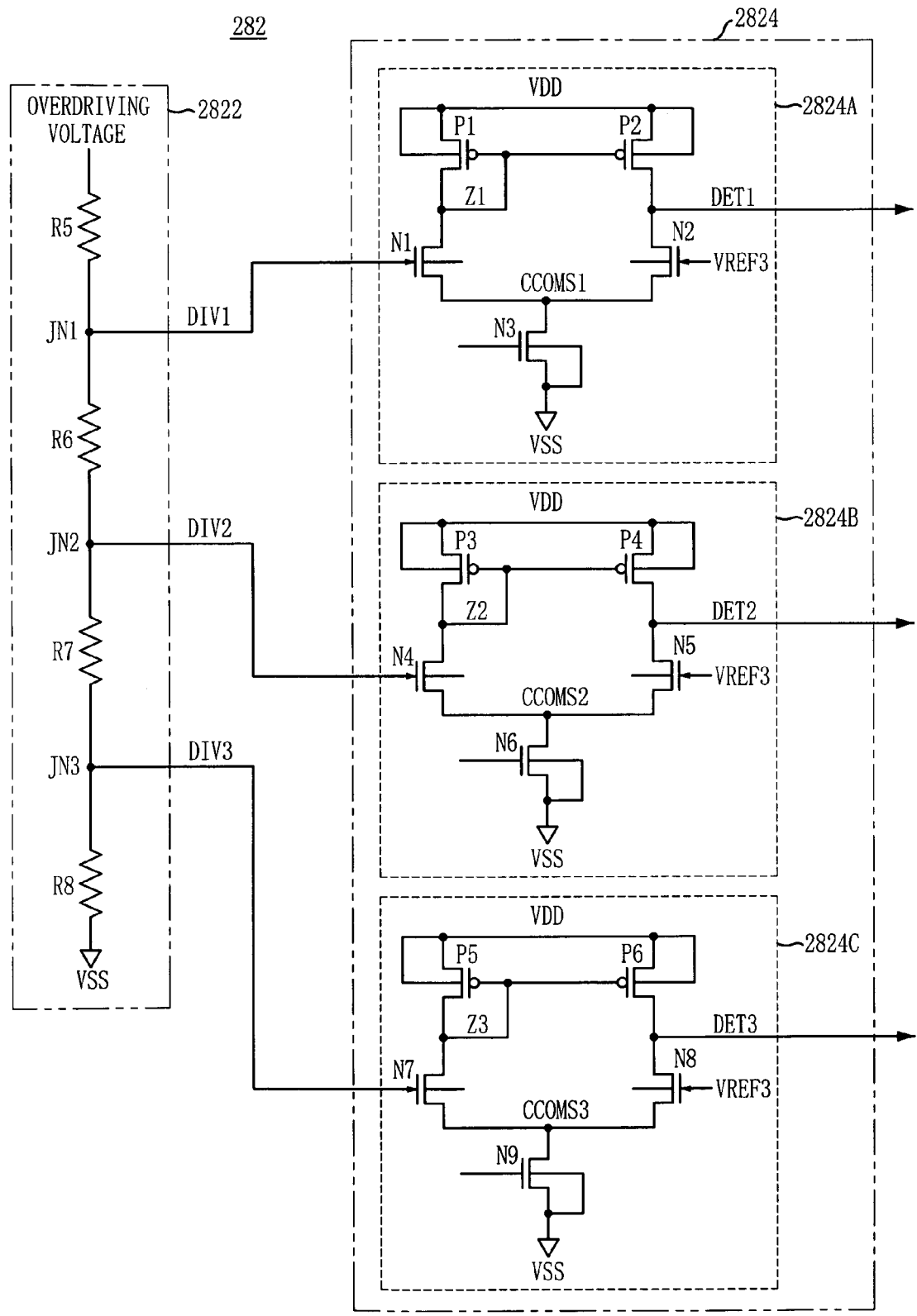
FIG. 6 is a schematic circuit diagram of a voltage detecting unit illustrated in FIG. 3.

FIG. 6 is a schematic circuit diagram of the voltage detecting unit illustrated in FIG. 3.

Referring to FIG. 6, the voltage dividing unit 2822 of the voltage detecting unit 282 divides the overdriving voltage by a plurality of ratios to output a plurality of divided voltages DIV1, DIV2 and DIV3 at different levels. The voltage comparing unit 2824 compares a reference voltage VREF3, which corresponds to the target overdriving voltage level, with each of the divided voltages DIV1, DIV2 and DIV3 to output a plurality of detection signals DET1, DET2 and DET3, levels of which are determined according to respective comparison results.

The voltage dividing unit 2822 includes a plurality of resistors R5, R6, R7 and R8 connected in series between the overdriving voltage terminal and the ground terminal VSS. The divided voltages DIV1, DIV2 and DIV3 are outputted at connection nodes JN1, JN2 and JN3 of the resistors R5, R6, R7 and R8.

More specifically, the voltage dividing unit 2822 includes the first to fourth resistors R5, R6, R7 and R8 connected in series between the overdriving voltage terminal and the ground terminal. The first divided voltage DIV1 is output at the connection node JN1 of the first resistor R5 and the second resistor R6. The second divided voltage DIV2 is output at the connection node of the second resistor R6 and the third resistor R7. The third divided voltage DIV3 is output at the connection node JN3 of the third resistor R7 and the fourth resistor R8.

The voltage comparing unit 2824 includes a plurality of comparators 2824A, 2824B and 2824C each configured to compare the reference voltage VREF3 with respective divided voltages DIV1, DIV2 and DIV3 to output the plurality of detection signals DET1, DET2 and DET3, levels of which are determined according to the respective comparison result.

More specifically, the first comparator 2824A compares the first divided voltage DIV1 with the reference voltage VREF3 to output the first detection signal DET1. The second comparator 2824B compares the second divided voltage DIV2 with the reference voltage VREF3 to output the second detection signal DET2. The third comparator 2824C compares the third divided voltage DIV3 with the reference voltage VREF3 to output the third detection signal DET3.

Figure 7:
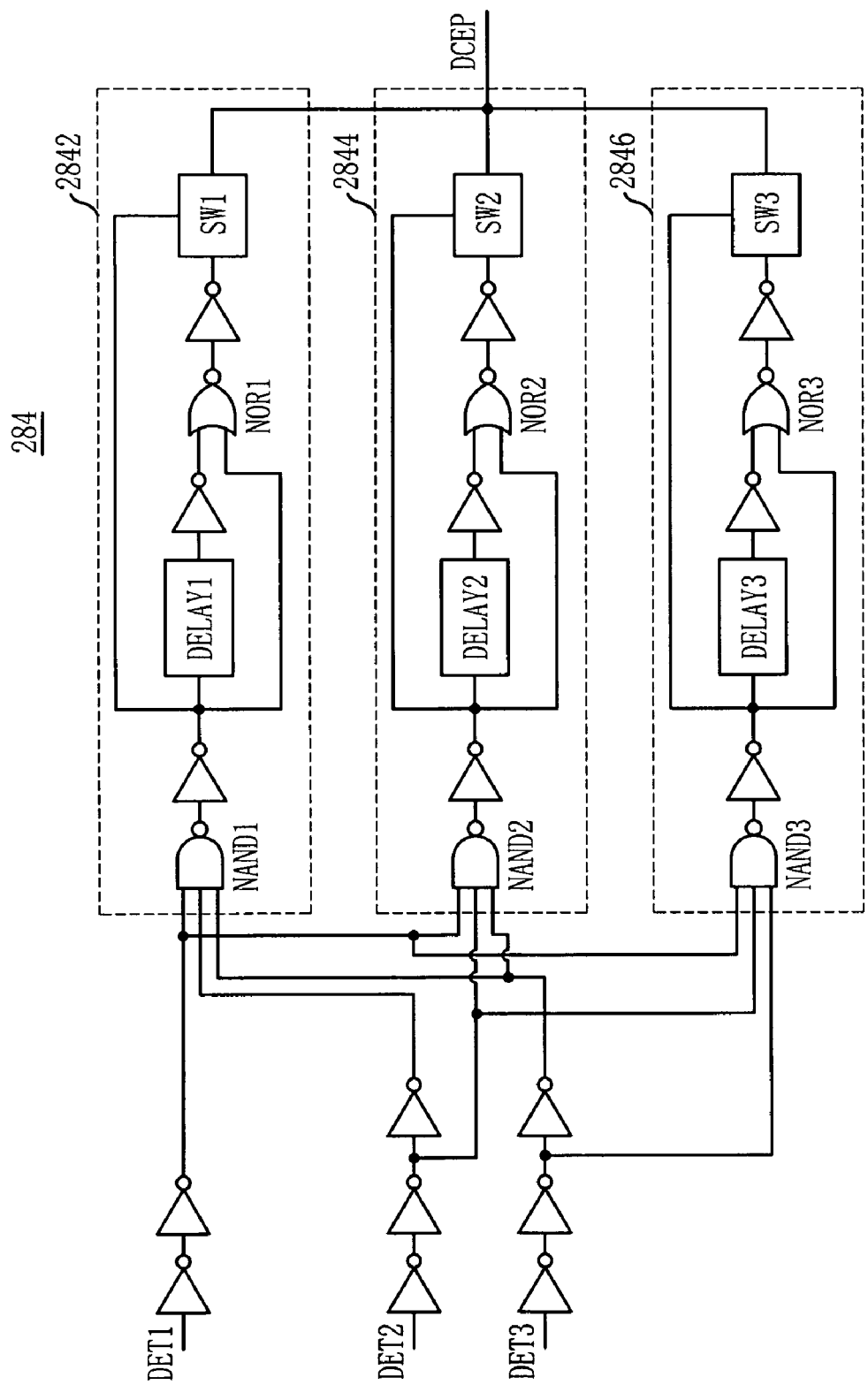
FIG. 7 is a schematic circuit diagram of an activation period adjusting unit illustrated in FIG. 3.

FIG. 7 is a schematic circuit diagram of the activation period adjusting unit illustrated in FIG. 3.

Referring to FIG. 7, the activation period adjusting unit 284 includes a first output unit 2842, a second output unit 2844, and a third output unit 2846. The first output unit 2842 outputs the discharge enable signal DCEP having an activation period for a first time interval when the first detection signal DET1 is activated and the second and third detection signals DET2 and DET3 are deactivated. The second output unit 2844 outputs the discharge enable signal DCEP having an activation period for a second time interval, which is longer than the first time interval, when the first and second detection signals DET1 and DET2 are activated and the third detection signal DET3 is deactivated. The third output unit 2846 outputs a discharge enable signal DCEP having an activation period for a third time interval, which is longer than the second time interval, when the first to third detection signals DET1, DET2 and DET3 are all activated.

The first output unit 2842 includes a first NAND gate NAND1, a first delay DELAY1, a first NOR gate NOR1, and a first switch SW1. The first NAND gate NAND1 is configured to perform a NAND operation on the first detection signal DET1, an inverted signal of the second detection signal DET2, and an inverted signal of the third detection signal DET3. The first delay DELAY1 delays an inverted signal of an output signal of the first NAND gate NAND1 by the first time interval. The first NOR gate NOR1 is configured to perform a NOR operation on an inverted signal of an output signal of the first delay DELAY1 and the inverted signal of an output signal of the first NAND gate NAND1. The first switch SW1 outputs an inverted signal of an output signal of the first NOR gate NOR1 as the discharge enable signal DCEP in response to the inverted signal of an output signal of the first NAND gate NAND1.

The second output unit 2844 includes a second NAND gate NAND2, a second delay DELAY2, a second NOR gate NOR2, and a second switch SW2. The second NAND gate NAND2 is configured to perform a NAND operation on the first detection signal DET1, the second detection signal DET2, and the inverted signal of the third detection signal DET3. The second delay DELAY2 delays an inverted signal of an output signal of the second NAND gate NAND2 by the second time interval. The second NOR gate NOR2 is configured to perform a NOR operation on an inverted signal of an output signal of the second delay DELAY2 and the inverted signal of an output signal of the second NAND gate NAND2. The second switch SW2 outputs an inverted signal of an output signal of the second NOR gate NOR2 as the discharge enable signal DCEP in response to the inverted signal of an output signal of the second NAND gate NAND2.

The third output unit 2846 includes a third NAND gate NAND3, a third delay DELAY3, a third NOR gate NOR3, and a third switch SW3. The third NAND gate NAND3 is configured to perform a NAND operation on the first to third detection signals DET1, DET2 and DET3. The third delay DELAY3 delays an inverted signal of an output signal of the third NAND gate NAND3 by the third time interval. The third NOR gate NOR3 is configured to perform a NOR operation on an inverted signal of an output signal of the third delay DELAY3 and the inverted signal of an output signal of the third NAND gate NAND3. The third switch SW3 outputs an inverted signal of an output signal of the third NOR gate NOR3 as the discharge enable signal DCEP in response to the inverted signal of an output signal of the third NAND gate NAND3.

An operation of the discharge enable signal generator 280 in accordance with the embodiment of the present invention will be described below with reference to FIGS. 6 and 7.

The voltage dividing unit 2822 divides the overdriving voltage by a plurality of ratios through the resistors R5, R6, R7 and R8 to produce the plurality of divided voltages DIV1, DIV2 and DIV3.

The resistors may have resistances different from or equal to one another. Although the four resistors are illustrated in FIG. 6, the number of the resistors may be greater or fewer, possibly with a correspondingly greater or fewer number of divided voltages DIV#.

The voltage comparing unit 2824 may include a larger number of comparators when a larger number of divided voltages are provided by a voltage dividing unit 2822 of modified design.

The operation of the discharge enable signal generator 280 will be described in more detail in association with the operation of the voltage dividing unit 2822 and the voltage comparing unit 2824 according to variation in the overdriving voltage level.

When the overdriving voltage begins to slowly increase with respect to the ground voltage VSS, the voltage levels applied to the first to third connection nodes JN1, JN2 and JN3 of the voltage dividing unit 2822 also begin to increase.

When the overdriving voltage exceeds a first level, the voltage level applied to the first connection node JN1 only exceeds the threshold voltage of the input transistor of the first comparator 2824A, i.e., an NMOS transistor N1, because the voltage level applied to the first connection node JN1 is highest one. Thus, the voltage level applied to a node Z1 decreases. A PMOS transistor P2 is turned on, and the first detection signal DET1 becomes a logic high level.

However, the voltage levels applied to the second and third connection nodes JN2 and JN3 are lower than the voltage level applied to the first connection node JN1. Thus, the voltage level applied to the second connection node JN2 does not exceed the threshold voltage of the input transistor of the second comparator 2824B, i.e., an NMOS transistor N4. Consequently, the voltage level applied to the third connection node JN3 does not exceed the threshold voltage of the input transistor of the third comparator 2824C, i.e., an NMOS transistor N7.

Therefore, the second detection signal DET2 output by the second comparator 2824B is maintained at a logic low level by an NMOS transistor N5 turned on by the reference voltage VREF3.

Similarly, the third detection signal DET3 output by the third comparator 2824C is maintained at a logic low level by an NMOS transistor N8 turned on by the reference voltage VREF3.

Likewise, when the overdriving voltage exceeds a second level higher than the first level, the voltage levels applied to the first and second connection nodes JN1 and JN2 respectively exceed the threshold voltages of the input transistors of the first and second comparators 2824A and 2824B, i.e., NMOS transistors N1 and N4. Thus, the first and second detection signals DET1 and DET2 become a logic high level.

Likewise, when the overdriving voltage exceeds a third level higher than the second level, the voltage levels applied to the first to third connection nodes JN1, JN2 and JN3 respectively exceed the threshold voltages of the input transistors of the first to third comparators 2824A, 2824B and 2824C, i.e., NMOS transistors N1, N4 and N7. Thus, the first to third detection signals DET1, DET2 and DET3 become a logic high level.

Thus, the voltage detecting unit 282 activates more of the detection signals as the overdriving voltage level becomes higher.

An operation of the activation period adjusting unit 284 illustrated in FIG. 7 is described in more detail with reference to FIG. 6.

When the overdriving voltage slowly exceeds the first level, the first detection signal DET1 becomes a logic high level and the second and third detection signals DET2 and DET3 become a logic low level, as described above. Thus, the inverted signal of an output signal of the first NAND gate NAND1 becomes a logic high level, and the inverted signals of output signals of the second and third NAND gates NAND2 and NAND3 become a logic low level.

When the inverted signal of the output signal of a first NAND gate NAND1 becomes a logic high level, the first switch SW1 is turned on. The inverted signals of output signals of the second and third NAND gates NAND2 and NAND3 become a logic low level, and the second and third switches SW2 and SW3 are turned off.

Therefore, the discharge enable signal DCEP is output with the activation period for the first time interval defined by the first delay DELAY1.

Likewise, when the overdriving voltage exceeds the second level higher than the first level, the first and second detection signals DET1 and DET2 become a logic high level and the third detection signal DET3 becomes a logic low level, as discussed above. Thus, the inverted signal of an output signal of the second NAND gate NAND2 becomes a logic high level and the inverted signals of output signals of the first and third NAND gates NAND1 and NAND3 become a low level.

When the inverted signal of an output signal of the second NAND gate NAND2 becomes a logic high level, the second switch SW2 is turned on. The inverted signals of output signals of the first and third NAND gates NAND1 and NAND3 become a logic low level, and the first and third switches SW1 and SW3 are turned off.

Therefore, the discharge enable signal DCEP is output with the activation period for the second time interval defined by the second delay DELAY2. As described above, the second time interval defined by the second delay DELAY2 is longer than the first time interval defined by the first delay DELAY1.

Likewise, when the overdriving voltage exceeds the third level higher than the second level, the first to third detection signals DET1, DET2 and DET3 become a logic high level. Thus, the inverted signal of an output signal of the third NAND gate NAND3 becomes a logic high level, and the inverted signals of output signals of the first and second NAND gates NAND1 and NAND2 become a logic low level.

When the inverted signal of an output signal of the third NAND gate NAND3 becomes a logic high level, the third switch SW3 is turned on. The inverted signals of output signals of the first and second NAND gates NAND1 and NAND2 become a logic low, and the first and second switches SW1 and SW2 are turned off.

Therefore, the discharge enable signal DCEP is output with the activation period for the third time interval defined by the third delay DELAY3. As described above, the third time interval defined by the third delay DELAY3 is longer than the second time interval defined by the second delay DELAY2.

Thus, the activation period adjusting unit 284 outputs the discharge enable signal DCEP with increasingly longer activation periods when the overdriving voltage level reaches correspondingly higher levels, and more detection signals DET1, DET2 and DET3 are activated. Conversely, the activation period adjusting unit 284 outputs the discharge enable signal DCEP with shorter activation periods as less detection signals DET1, DET2 and DET3 are activated.

Figure 8:
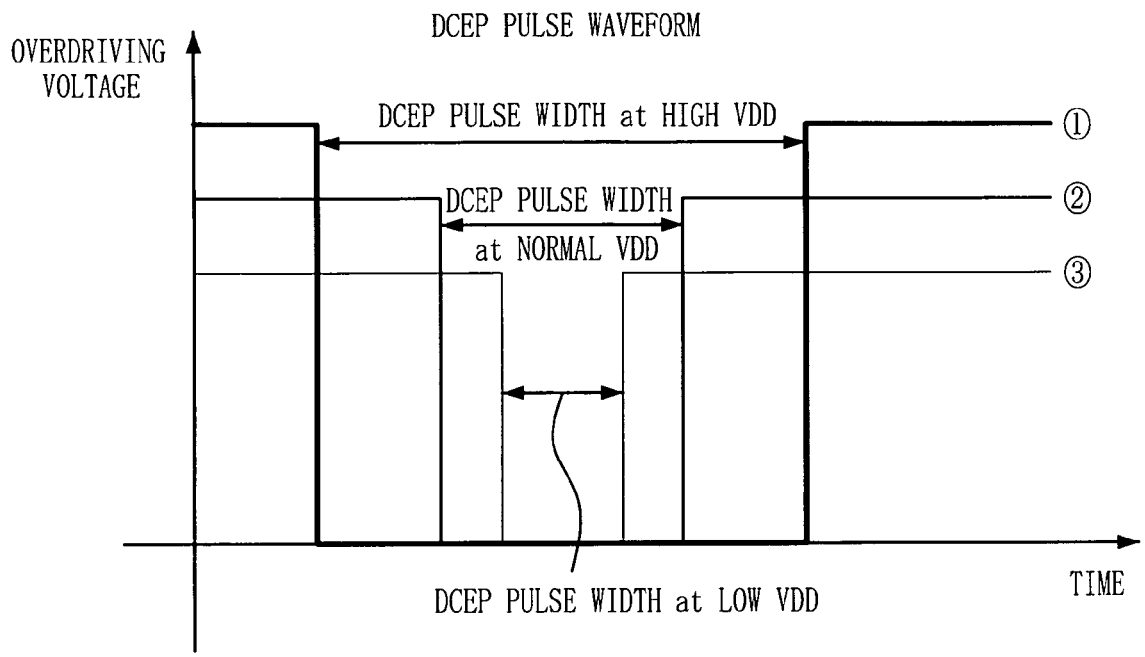
FIG. 8 is a signal timing diagram illustrating the level of a discharge enable signal in an overdriving operation of the semiconductor memory device in accordance with an embodiment of the present invention.

FIG. 8 is a signal timing diagram illustrating the level of the discharge enable signal during an overdriving operation of the semiconductor memory device in accordance with an embodiment of the present invention.

It can be seen from FIG. 8 that the level of the discharge enable signal DCEP output by the discharge enable signal generator 280 varies according to the overdriving voltage level during the overdriving operation.

When the overdriving voltage is at a high VDD, the discharge enable signal DCEP has the longest pulse width, as illustrated by reference numeral ①.

When the overdriving voltage is at a low VDD, the discharge enable signal DCEP has the shortest pulse width, as illustrated by reference numeral ③.

When the overdriving voltage is at a normal VDD, the pulse width of the discharge enable signal DCEP is shorter than the first case ① and longer than the third case ③, as illustrated by reference numeral ②.

Figure 9:
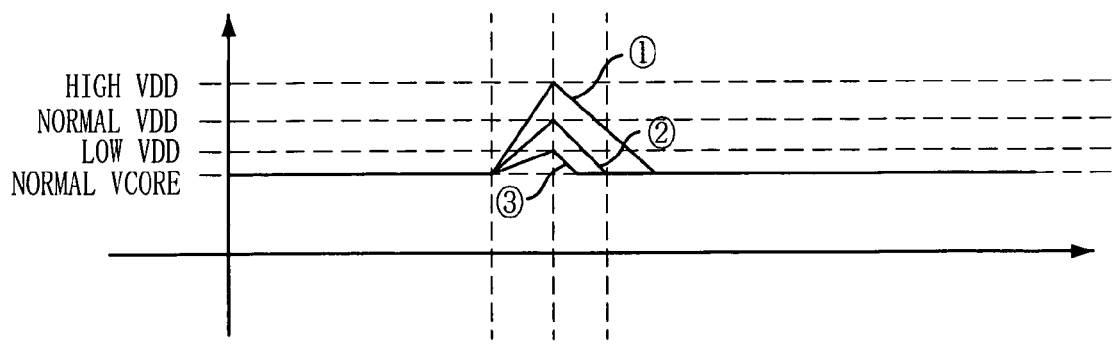
FIG. 9 is a signal timing diagram illustrating the level of a voltage applied to a normal driving voltage terminal in the overdriving operation and the subsequent normal driving operation in the semiconductor memory device in accordance with an embodiment of the present invention.

FIG. 9 is a signal timing diagram illustrating the level of the voltage applied to the normal driving voltage terminal during an overdriving operation and the subsequent normal driving operation in a semiconductor memory device in accordance with an embodiment of the present invention.

Referring to FIG. 9, the voltage level of the normal driving voltage terminal returns to the normal VCORE, which is a level prior to the overdriving operation, in the normal driving operation even though the voltage level of the normal driving voltage terminal varies during the overdriving operation, e.g., at a high VDD, normal VDD, or low VDD, due to variation of the overdriving voltage level.

That is, when the voltage level of the normal driving voltage terminal varies in the cases labeled ①, ② and ③, the operating time of the normal driving voltage discharge driver 260 is varied accordingly. Thus, the voltage level of the normal driving voltage terminal returns to the normal VCORE in the subsequent normal driving operation in each of the cases ①, ② and ③.

Even though the overdriving voltage level is higher or lower than a predefined level, potentially causing the voltage level of the normal driving voltage terminal to become unstable during an overdriving operation, the voltage level of the normal driving voltage terminal can be stabilized in the subsequent normal driving operation due to the variation of the pulse width of the discharge enable signal DCEP according to the variation of the overdriving voltage level.

Thus, failures of the semiconductor memory device due to variations of the overdriving voltage level can be prevented.

Although the core voltage VCORE and the power supply voltage VDD are used as the normal driving voltage and the overdriving voltage in the above-described embodiments of the present invention, other voltages can be used as the normal driving voltage and the overdriving voltage.

Further, although the normal driver drives the voltage lines of the bit line sense amplifier and the overdriving unit drives the normal driving voltage terminal in the above-described embodiments of the present invention, the voltage lines of the bit line sense amplifier can also be driven in parallel by the overdriving unit and the normal driver.

Locations and types of the logic gates and the transistors in the above-described embodiments of the present invention can be changed according to alternative logic levels for the signals.

In accordance with the present invention, in case that the voltage level applied to the normal driving voltage terminal becomes unstable in the overdriving operation due to the variation of the overdriving voltage level, the voltage applied to the normal driving voltage terminal in the subsequent normal driving operation can be stabilized by adjusting the activation period of the discharge enable signal according to the variation of the overdriving voltage level.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a bit line sense amplifier for performing an amplification operation using a normal driving voltage or an overdriving voltage to sense and amplify data applied to bit lines;
    a normal driving voltage compensator configured to drive a normal driving voltage terminal according to a voltage level of the normal driving voltage terminal and target normal driving voltage levels; and
    a discharge enable signal generator configured to generate a discharge enable signal by adjusting an activation period of the discharge enable signal according to the overdriving voltage.

2. The semiconductor memory device as recited in claim 1, wherein the normal driving voltage compensator includes:
    a normal driving voltage discharge driver configured to pull down the normal driving voltage terminal when the voltage level of the normal driving voltage terminal is higher than a first target normal driving voltage level; and
    a normal driving voltage charge driver configured to pull up the normal driving voltage terminal when the voltage level of the normal driving voltage terminal is lower than a second target normal driving voltage level.

3. The semiconductor memory device as recited in claim 1, wherein the bit line sense amplifier includes:
    a bit line sense amplifying unit configured to sense and amplify the data applied to the bit lines; and
    a voltage line driving unit configured to drive voltage lines of the bit line sense amplifier using the normal driving voltage or the overdriving voltage.

4. The semiconductor memory device as recited in claim 1, wherein the discharge enable signal generator includes:
    a voltage detecting unit configured to detect the overdriving voltage level to output a plurality of detection signals, levels of which are determined according to the detection result; and
    an activation period adjusting unit configured to adjust the activation period of the discharge enable signal according to the detection signals.

5. The semiconductor memory device as recited in claim 4, wherein the voltage detecting unit includes:
    a voltage dividing unit configured to divide the overdriving voltage level by a plurality of ratios to output a plurality of divided voltages having different levels; and
    a voltage comparing unit configured to compare a reference voltage corresponding to a target overdriving voltage level with the plurality of divided voltages to output the plurality of detection signals.

6. The semiconductor memory device as recited in claim 5, wherein the voltage dividing unit includes a plurality of resistors connected in series between an overdriving voltage terminal and a ground terminal and defining a predefined resistance, the plurality of divided voltages being output at connection nodes of the resistors.

7. The semiconductor memory device as recited in claim 5, wherein the voltage comparing unit includes a plurality of comparators each configured to compare the reference voltage with a respective one of the plurality of divided voltages to output the plurality of detection signals, levels of which are determined according to the comparison result.

8. The semiconductor memory device as recited in claim 4, wherein the activation period adjusting unit outputs the discharge enable signal having a longer activation period as a larger number of the detection signals are activated.

9. The semiconductor memory device as recited in claim 4, wherein the activation period adjusting unit outputs the discharge enable signal having a shorter activation period as a smaller number of the detection signals are activated.

10. The semiconductor memory device as recited in claim 5, wherein the voltage dividing unit includes first to fourth resistors connected in series between an overdriving voltage terminal and a ground terminal and each resistor having a predefined resistance;
    a first divided voltage is output at a connection node of the first resistor and the second resistor;
    a second divided voltage is output at a connection node of the second resistor and the third resistor; and
    a third divided voltage is output at a connection node of the third resistor and the fourth resistor.

11. The semiconductor memory device as recited in claim 10, wherein the voltage comparing unit includes:
    a first comparator configured to compare the first divided voltage with the reference voltage to output a first detection signal;
    a second comparator configured to compare the second divided voltage with the reference voltage to output a second detection signal; and
    a third comparator configured to compare the third divided voltage with the reference voltage to output a third detection signal.

12. The semiconductor memory device as recited in claim 11, wherein the activation period adjusting unit includes:
    a first output unit configured to output the discharge enable signal having an activation period for a first time interval when the first detection signal is activated and the second and third detection signals are deactivated;
    a second output unit configured to output the discharge enable signal having an activation period for a second time interval longer than the first time interval when the first and second detection signals are activated and the third detection signal is deactivated; and
    a third output unit configured to output the discharge enable signal having an activation period for a third time interval longer than the second time interval when the first to third detection signals are activated.

13. The semiconductor memory device as recited in claim 12, wherein the first output unit includes:
    a first NAND gate configured to perform a NAND operation on the first detection signal, an inverted signal of the second detection signal, and an inverted signal of the third detection signal;
    a first delay configured to delay an inverted signal of an output signal of the first NAND gate for the first time interval;
    a first NOR gate configured to perform a NOR operation on an inverted signal of an output signal of the first delay and the inverted signal of an output signal of the first NAND gate; and
    a first switch configured to output an inverted signal of an output signal of the first NOR gate as the discharge enable signal in response to the inverted signal of an output signal of the first NAND gate.

14. The semiconductor memory device as recited in claim 13, wherein the second output unit includes:
- a second NAND gate configured to perform a NAND operation on the first detection signal, the second detection signal, and an inverted signal of the third detection signal;
- a second delay configured to delay an inverted signal of an output signal of the second NAND gate for the second time interval;
- a second NOR gate configured to perform a NOR operation on an inverted signal of an output signal of the second delay and the inverted signal of an output signal of the second NAND gate; and
- a second switch configured to output an inverted signal of an output signal of the second NOR gate as the discharge enable signal in response to the inverted signal of an output signal of the second NAND gate.

15. The semiconductor memory device as recited in claim 14, wherein the third output unit includes:
- a third NAND gate configured to perform a NAND operation on the first to third detection signals;
- a third delay configured to delay an inverted signal of an output signal of the third NAND gate for the third time interval;
- a third NOR gate configured to perform a NOR operation on an inverted signal of an output signal of the third delay and the inverted signal of an output signal of the third NAND gate; and
- a third switch configured to output an inverted signal of an output signal of the third NOR gate as the discharge enable signal in response to the inverted signal of an output signal of the third NAND gate.

* * * * *